United States Patent [19]

John et al.

[11] Patent Number: 5,416,361
[45] Date of Patent: May 16, 1995

[54] LOW DISSIPATION SNUBBER FOR SWITCHING POWER TRANSISTOR

[75] Inventors: Paul John, Hazlet; Walter G. Kutzavitch, Freehold, both of N.J.

[73] Assignee: AT&T Corp., Murray Hill, N.J.

[21] Appl. No.: 115,064

[22] Filed: Sep. 2, 1993

[51] Int. Cl.6 .................. H03K 17/60; H03K 17/687; H03K 3/01
[52] U.S. Cl. ..................... 327/310; 327/110; 327/379
[58] Field of Search ............... 307/253, 571, 263, 572, 307/296.3, 296.4, 296.5, 547, 549, 550, 551, 296.1, 548

[56] References Cited

U.S. PATENT DOCUMENTS

| | | | |
|---|---|---|---|
| 3,158,791 | 10/1962 | Deneen, Jr. et al. | 317/148.5 |
| 4,010,387 | 3/1977 | Akamatsu | 307/253 |
| 4,015,185 | 3/1977 | Pollmeier | 321/44 |
| 4,167,776 | 9/1978 | Nygaard | 363/56 |
| 4,276,588 | 6/1979 | McLyman et al. | 363/56 |
| 4,336,587 | 6/1981 | Boettcher, Jr. et al. | 363/134 |
| 4,414,479 | 7/1981 | Foley | 307/253 |

FOREIGN PATENT DOCUMENTS

| | | | |
|---|---|---|---|
| 653975 | 12/1962 | Canada | 307/253 |
| 56-76631 | 6/1981 | Japan | 307/253 |

Primary Examiner—William L. Sikes
Assistant Examiner—Tiep H. Nguyen
Attorney, Agent, or Firm—John A. Caccuro

[57] ABSTRACT

A high efficiency switching power transistor uses the energy in a snubber circuit to drive the gate driver and the pulse-width-modulator (PWM). The snubber consists of a resistor and a capacitor connected in series between the drain and source of a field-effect-transistor (FET). A steering diode is connected from the junction between the capacitor and the resistor to the power supply of the gate driver and PWM. This diode steers current from the snubber and makes it flow into the power supply thereby lowering the power requirements of the power supply. This energy would have been dissipated in the snubber as heat if it were not used this way. Efficiency of the switcher is increased both by lowering heat loss in the snubber and by using recovered snubber energy to lower the power requirements of the power supply of the gate driver and PWM.

14 Claims, 2 Drawing Sheets

LOW DISSIPATION SNUBBER FOR SWITCHING POWER TRANSISTOR

FIELD OF THE INVENTION

The invention relates to circuits employing power switching transistors such as switching power supplies. In particular, it relates to improvements in the snubber circuit for such power switching transistors.

BACKGROUND OF THE INVENTION

DC to DC converters utilize a power switching transistor that is connected to a transformer or inductor to derive the appropriate output voltage(s). When the transistor turns off, drain-to-source current reduces from a high value to zero, the drain-to-source or collector-to-emitter voltage rises sharply due to the energy stored in the inductance. This high voltage can result in drain-to-source or collector-to-emitter junction breakdown in the transistor, which can destroy the transistor.

A snubber is used to prevent junction breakdown of the switching transistor. With reference to FIG. 1, a conventional snubber 130 is made up of resistor 120 connected in series with capacitor 115. It is connected across the drain-source terminals of FET 111. When FET 111 turns off, the voltage rise between the drain (D) and source (S), caused by inductive load 113, is controlled by the RC network of resistor 120 and capacitor 115. The voltage is prevented from reaching damagingly high levels because the voltage rise on capacitor 115 is dictated by the RC load.

In conventional designs, pulse width modulator (PWM) 121 and gate driver 112 have their own power supply 117 (shown by zener 117). Current is provided by resistor 114 into the power supply 117 to power the PWM and gate driver. This means energy is dissipated as heat in resistor 114.

An improvement of the conventional method is disclosed in U.S. Pat. No. 4,414,479 issued to James Foley on Nov. 8, 1983. Foley's figure is duplicated in FIG. 2 with the elements renumbered. He powers his base driver 212 with charge stored in snubber capacitor 215. This is an improvement since the switching transistor 211 does not have to discharge capacitor 215 when it turns on, instead this energy is used to power the base driver 212. The base driver 212 needs no external power supply. This improves efficiency of the switching transistor. This circuit, however, has a few shortcomings. In an AC to DC power supply (commonly called an off-line switcher), AC voltage is rectified to a DC voltage (for 120 Vac this is approximately 170 Vdc). The base driver 212 and the PWM (not shown) power supplies are typically between 5-15 Vdc. When transistor 211 is off, resistor 216 has about 160 Vdc on it, assuming power supply 217 is a 10 V power supply. This means for low power loss in resistor 216, its value has to be high. If resistor 216's value is high, not enough current can be pumped into the power supply such that a PWM and the base driver 212 can both be powered using snubber power. Thus, Foley can only provide a limited increase in power efficiency.

SUMMARY OF THE INVENTION

The invention provides an improved snubber circuit for use in a controllable switching circuit which switches between conductive and nonconductive states to alternately connect and disconnect an inductive load at a power source. The snubber circuit includes a capacitor and a resistor connected in series across the switching circuit; and a diode connected at one end to the junction of the capacitor and the resistor and at the other end connected to provide power to the control circuit wherein a voltage change which develops across the inductive load when the switching circuit is switched to a non-conductive state, is shunted to power the control circuit.

In one embodiment, the switching circuit includes a driver circuit and a pulse width modulator (PWM) for controlling the on-off duty cycle of the switching circuit. In another embodiment, the switching circuit is a field-effect-transistor (FET) and the capacitor and resistor are connected between a drain (D) and a source (S) terminal of the FET. The control circuit control signal is connected to a gate (G) terminal of the FET.

DETAILED DESCRIPTION

Figure 3:
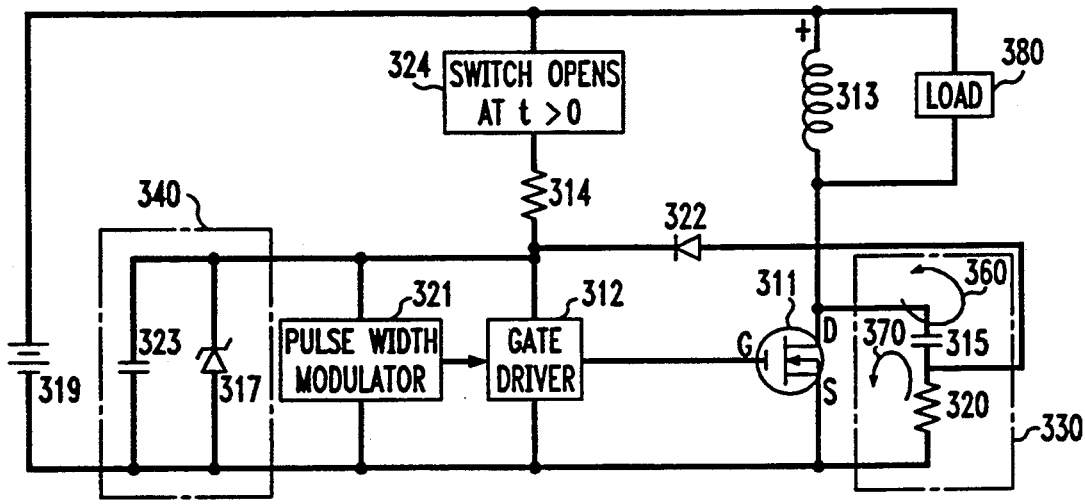
FIG. 3 is a circuit diagram of the improved snubber circuit according to the present invention.

With reference to FIG. 3, the invention provides an improved snubber circuit for use with, for example, a switching power regulator including one or more power transistors. The snubber 330 powers the PWM 321 in addition to the driver circuit 312. Thus no separate power source is necessary to drive the PWM 321. This means that resistor 114's value can be increased. This results in lower power dissipation in resistor 114 and this improves power efficiency of the switching regulator.

The snubber 330 consists of capacitor 315 connected in series with resistor 320. This series arrangement is connected across the drain (D) and source (S) terminals of FET 315. Steering diode 322 connects from the junction of resistor 320 and capacitor 315 to the power supply 340 of PWM 321 and gate driver 312 (the power supply is represented by zener diode 317 and capacitor 323).

In an AC to DC converter, AC is rectified to DC first. For example, the rectified DC voltage 319 is about 170 Vdc. This voltage exists between the top of inductor 313 labeled +, and the source (S) of FET 311 when the FET is off. Capacitor 315 charges, to about 160 Vdc, via diode 322 when FET 311 is off. The capacitor can charge to a maximum of 170 Vdc minus power supply 340 voltage (illustratively, about 10 Vdc) through diode 322. This charging puts energy into power supply 340 since the charge current flows into it via diode 322. The capacitor can then charge further through resistor 320.

When PWM 321 decides to turn on FET 311, it signals gate driver 312 to turn on, which in turn applies a gate control voltage between gate and source of FET 311. As a result, FET 311 turns on causing the voltage at the drain terminal to go to about 0 Vdc. The voltage on both sides of capacitor 315 decreases by about 170 Vdc. This negative voltage at the junction of resistor 320 and capacitor 315 further reverse biases diode 322. Now capacitor 315 starts discharging through resistor 320. Capacitor 315 can discharge fully (via path 370), which is dictated by the RC time constant, if FET 311 remains "on" long enough.

When FET 311 turns off, capacitor 315 begins to charge again through diode 322 as mentioned above (via path 360). This dumps a portion of the L di/dt energy of inductive load 313 into power supply 340 via diode 322. The load 380 is driven by the switching circuit.

Figure 1:
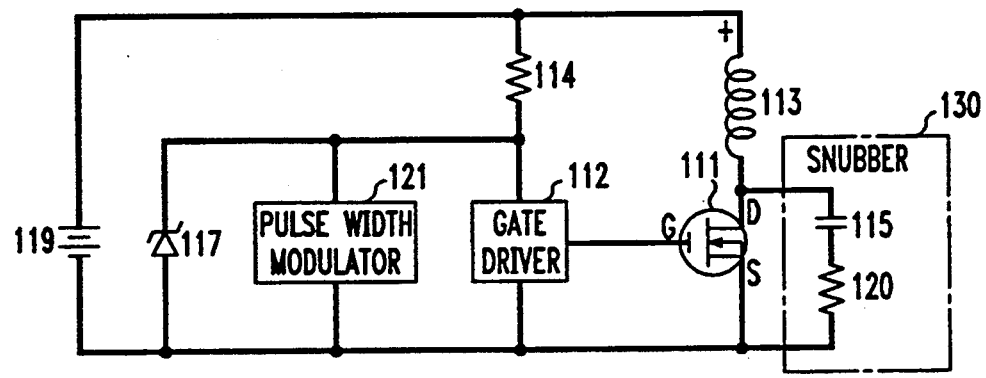
FIG. 1 is a circuit diagram of a conventional snubber circuit.

Resistor 314 is present to provide enough power to turn FET 311 "on" for the first time. From then on the resistor can be removed or switched out of the circuit (by switch 324). If switch 324 is not used, for a 120 V AC to DC switching regulator, the resistor 314 value can be, illustratively, about 150 kilo ohms. This results in only about 190 milliwatts of power dissipation in resistor 314. Several orders of magnitude of power would have been dissipated in this resistor if the conventional snubber circuit shown in FIG. 1 was used. Alternatively, resistor 314 can be utilized without switch 324 with the result that the power efficiency of the switching regulator will be further increased.

Figure 2:
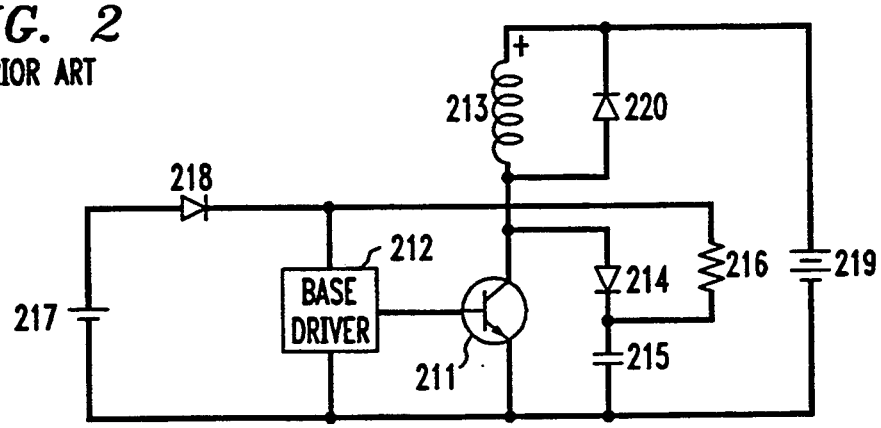
FIG. 2 is a circuit diagram of the Foley U.S. Pat. No. 4,414,479.

As described previously, in Foley's circuit (FIG. 2), the value of resistor 216 has to be a high value to reduce its heat dissipation. However, when resistor 216 is a high value, not enough current can be steered into the power supply of base driver 211. Thus, with the limited power Foley is only able to drive his base driver 212. In the present invention, snubber 330 provides enough energy each cycle to power both PWM 321 and gate driver 312, thereby improving the power efficiency of the switching regulator.

While the present invention has been described using a FET power transistor, it should be understood that the invention will work with vacuum tubes and other types of power transistors, such as bi-polar transistors, transistors in Darlington configurations, etc. Also, load 380 could be transformer-coupled instead of being directly connected across inductor 313.

Figure 4:
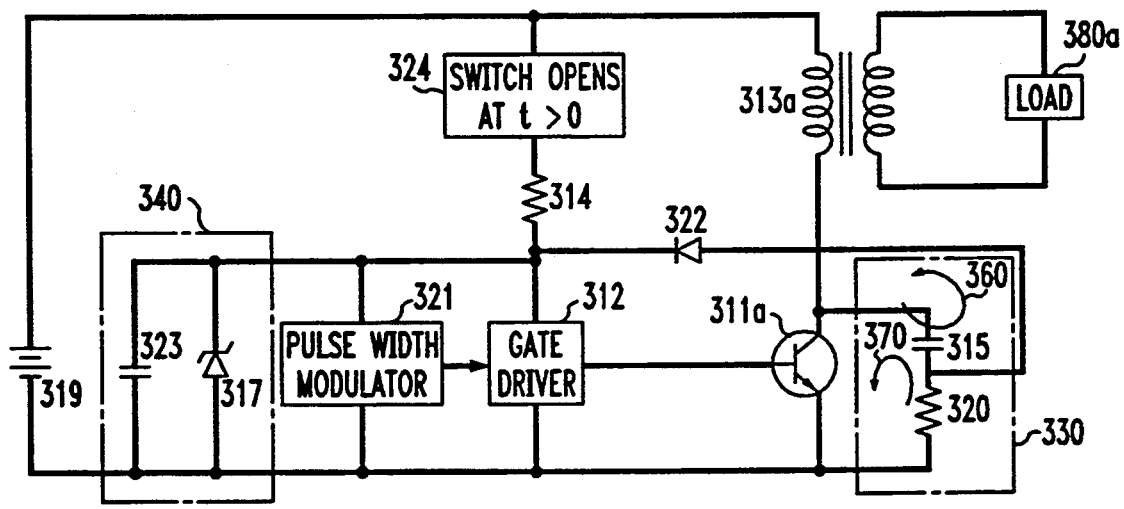
FIG. 4 is another embodiment of the present invention.

FIG. 4 shows the circuit of FIG. 3 arranged with a bi-polar transistor 311 a substituted for FET 311 and a transformer 313a which couples load 380a to the switching power regulator.

What has been described is merely illustrative of the application of the principles of the present invention. Other arrangements and methods can be implemented by those skilled in the art without departing from the spirit and scope of the present invention.

We claim:

1. An improved snubber circuit for use in a switching transistor circuit including at least one power transistor, the transistor circuit being of a type responsive to control signals for rapidly switching the transistor between conductive and non-conductive states to alternately connect and disconnect an inductive load and a power source, comprising
    a second power source having a charge storage element connected to a control circuit and a source terminal of the transistor to provide power to said control circuit which controls on-off switching of said transistor, and
    a diode, a capacitor and a resistor, said capacitor and said resistor being connected in series. respectively, between the drain terminal and the source terminal of the transistor, and said diode being connected at one end to a junction of said capacitor and said resistor and at another end to said control circuit in a manner such that current flows from said capacitor through said diode to charge the second power source when the transistor is in a non-conductive state, said second power source discharges powering the transistor when the transistor is switched to a conductive state, said capacitor being discharged through a path between the drain and source terminals of the transistor, when the transistor is in a conductive state.

2. The snubber circuit of claim 1 further comprising a pulse width modulator circuit for controlling an on-off duty cycle of said control circuit and wherein said current flow through said diode is also used to provide power to said pulse width modulator circuit.

3. The snubber circuit of claim 1 wherein said control circuit includes
    means for receiving a control circuit current from said power source and
    means for switching off said gate drive circuit current after a predetermined time after a start up of said switching transistor circuit.

4. The snubber circuit of claim 1 wherein said inductive load is an inductor having an impedance connected across it.

5. The snubber circuit of claim 1 wherein said inductive load is a primary of a transformer, a secondary of the transformer is connected across an impedance.

6. The snubber circuit of claim 1 wherein the charge storage element includes a capacitor which is charged when the transistor is in a non-conductive state.

7. An improved snubber circuit for use in a controllable switching circuit which switches between conductive and non-conductive states to alternately connect and disconnect an inductive load and a power source, comprising
    a control circuit for generating a signal to control said switching circuit,
    a second power source having a charge storage element connected to provide power to said control circuit,
    a diode, a capacitor and a resistor, said capacitor and said resistor being connected in series across said switching circuit, said diode being connected at one end to a junction of said capacitor and said resistor and at another end connected to said second power source, wherein a voltage change which develops across the load when said switching circuit is switched to a non-conductive state is coupled via said capacitor to said second power source, said second power source powering the control circuit when said switching circuit is switched to a conductive state.

8. The snubber circuit of claim 7 wherein said switching circuit includes a bi-polar transistor having a base, emitter, and collector, said base receiving said control signal and said collector and said emitter connected across the series connection of said capacitor and resistor.

9. The snubber circuit of claim 7 wherein said switching circuit is a field-effect transistor having a gate, a source, and a drain, said gate receiving said control signal and said drain and said source connected across the series connection of said capacitor and resistor.

10. The snubber circuit of claim 7 wherein said control circuit includes
    a driver circuit for providing said control signal to said switching circuit and a pulse width modulator circuit for controlling an on-off duty cycle of said control signal.

11. The snubber circuit of claim 7 wherein said control circuit includes means for receiving power from said power source and switch means connected to said power receiving means for interrupting said power to said control circuit a predetermined time after power is applied to said switching circuit.

12. The snubber circuit of claim 7 wherein said control circuit includes a bias resistor connected to said power source, said bias resistor having a value higher than that needed to enable the switching circuit to operate at its normal load value.

13. The snubber circuit of claim 7 wherein said inductive load is an inductor having an impedance connected across it.

14. The snubber circuit of claim 7 wherein said inductive load is a primary of a transformer, a secondary of the transformer connected across an impedance.

* * * * *